United States Patent
Barbut et al.

(10) Patent No.: US 11,531,046 B2
(45) Date of Patent: Dec. 20, 2022

(54) CURRENT SENSOR DEVICE

(71) Applicant: Melexis Technologies SA, Bevaix (CH)

(72) Inventors: Lucian Barbut, Bevaix (CH); Francis Monchal, Grasse (FR); Simon Houis, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 17/484,011

(22) Filed: Sep. 24, 2021

(65) Prior Publication Data
US 2022/0099709 A1 Mar. 31, 2022

(30) Foreign Application Priority Data
Sep. 25, 2020 (EP) ..................... 20198382

(51) Int. Cl.
*G01R 15/20* (2006.01)
*G01R 19/32* (2006.01)

(52) U.S. Cl.
CPC ......... *G01R 15/202* (2013.01); *G01R 15/205* (2013.01); *G01R 19/32* (2013.01)

(58) Field of Classification Search
CPC ..... G01R 15/202; G01R 15/205; G01R 19/32
See application file for complete search history.

(56) References Cited

U.S. PATENT DOCUMENTS

| | | | |
|---|---|---|---|
| 2007/0029999 A1* | 2/2007 | Middelhoek | G01R 33/07 324/251 |
| 2010/0156394 A1* | 6/2010 | Ausserlechner | G01R 15/202 324/144 |
| 2011/0304327 A1* | 12/2011 | Ausserlechner | G01R 33/072 324/239 |
| 2012/0146164 A1 | 6/2012 | Ausserlechner | |
| 2013/0265036 A1 | 10/2013 | Friedrich et al. | |
| 2013/0342194 A1* | 12/2013 | Motz | G01R 33/066 257/E27.005 |
| 2016/0377690 A1 | 12/2016 | Huber et al. | |
| 2020/0191834 A1* | 6/2020 | Bilbao De Mendizabal | G01R 15/205 |
| 2020/0191835 A1 | 6/2020 | Bilbao De Mendizabal | |

FOREIGN PATENT DOCUMENTS

WO 20190038964 A1 2/2019

OTHER PUBLICATIONS

Extended Search Report from corresponding EP Application No. EP20198382.2, dated Feb. 26, 2021.

* cited by examiner

*Primary Examiner* — Alvaro E Fortich
(74) *Attorney, Agent, or Firm* — Workman Nydegger (57) ABSTRACT

A sensor device includes a silicon substrate having an active surface; a first sensing area disposed near a first edge of the active surface of the silicon substrate such that the first sensing area has at least one first magnetic sensing element is made of a first compound semiconductor material and contact pads; and a second sensing area disposed near a second edge of the active surface of the silicon substrate, such that the second edge is substantially opposite to the first edge, such that the second sensing area has at least one second magnetic sensing element made of a second compound semiconductor material and contact pads. A processing circuit is disposed of in the silicon substrate and is electrically connected via wire bonds and/or a redistribution layer with the contact pads of the first and second sensing areas.

14 Claims, 6 Drawing Sheets

CURRENT SENSOR DEVICE

FIELD OF THE INVENTION

The present invention is generally related to the field of integrated current sensor structures.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field associated with a current passing through a conductor or magneto-resistive materials whose electrical resistance changes in response to an external magnetic field.

Conventional current sensors based on Hall effect elements are well known in the art. The Hall effect is the production of a voltage difference (the Hall voltage) across an electrically conductive material (such as a wire), transverse to the electric current in the material and to an applied magnetic field perpendicular to the current. The voltage difference can be measured and, if the applied magnetic field is known, the current in the electrically conductive material can be deduced. Such a current sensor can be called a magnetic current sensor.

Another type of conventional current sensor uses a magnetoresistance element, which changes resistance in response to a magnetic field associated with a current passing through a conductor. A fixed electrical current is directed through the magnetoresistance element, thereby generating a voltage output signal proportional to the magnetic field. Conventional current sensors of this type use an anisotropic magnetoresistance (AMR) element mounted on a dielectric material, for example a circuit board.

Various parameters characterize the performance of current sensors, including sensitivity and linearity. Sensitivity is related to a change in the resistance of the magnetoresistance element or a change in output voltage from the Hall effect element in response to a change in magnetic field. Linearity is related to the degree to which the resistance of the magnetoresistance element or the output voltage from the Hall effect element varies in direct linear proportion to the magnetic field.

Silicon-based Hall sensors implemented on a CMOS integrated circuit have been widely employed, due to their suitability of integration. However, one known drawback of this type of solutions is the poor signal-to-noise ratio of the current sensor structure.

One known way to increase the sensitivity of the current sensor structure is to use Hall effect elements fabricated on III-V semiconductor materials (e.g. on GaAs) instead of Si.

Hence, there is a need for a current sensor device so designed that an improved sensitivity is obtained compared to state of the art solutions currently on the market.

SUMMARY OF THE INVENTION

It is an object of embodiments of the present invention to provide for a current sensor device that allows for increased signal-to-noise ratios while keeping the manufacturing cost under control.

The above objective is accomplished by the solution according to the present invention.

In a first aspect the invention relates to a current sensor device comprising:
  a silicon substrate having an active surface,
  a first sensing area disposed near a first edge of the active surface of the silicon substrate, said first sensing area comprising at least one first magnetic sensing element made of a first compound semiconductor material and at least four contact pads,
  a second sensing area disposed near a second edge of the active surface of the silicon substrate, said second edge being substantially opposite to the first edge, said second sensing area comprising at least one second magnetic sensing element made of a second compound semiconductor material and at least four contact pads,
  a processing circuit disposed in said silicon substrate and electrically connected via wire bonds and/or a redistribution layer with said contact pads of the first and of the second sensing area and arranged to derive a first signal based on signals received from the at least one first magnetic sensing element of the first sensing area, to derive a second signal based on signals received from the at least one second magnetic sensing element of the second sensing area and to compute a difference between the first and the second signal.

The proposed solution indeed allows for a higher sensitivity and thus higher signal-to-noise ratios due to the use of two sensing areas, each containing at least one magnetic sensing element. The two sensing areas are advantageous for obtaining a differential implementation. Also the use of compound semiconductor material for the magnetic sensing elements contributes in achieving an improved sensitivity. By positioning the two sensing areas near opposite edges of the active surface of the substrate the magnetic field gradient is increased.

In a preferred embodiment the first sensing area comprises at least two first magnetic sensing elements and the second sensing area comprises at least two second magnetic sensing elements. The first and the second sensing area, respectively, then each comprises a cluster of sensing elements. This makes the current sensing device particularly suitable for reducing thermal noise and offset drift.

In some embodiments the at least one first magnetic sensing element and/or the at least one second magnetic sensing element is/are so positioned that there is no overlap with a lead frame of the current sensor device.

Preferably the first compound semiconductor material and/or the second compound semiconductor material is a III-V semiconductor material. Advantageously the first compound semiconductor material is the same as the second compound semiconductor material.

In a preferred embodiment the first sensing elements in the first sensing area and the second sensing elements in the second sensing area consist of non-magnetic semiconductor material. In some embodiments the silicon substrate is in non-magnetic material.

In a preferred embodiment the current sensor device is coreless, meaning that the sensor device does not comprise any material to concentrate the magnetic field.

In embodiments the first compound semiconductor material and/or the second compound semiconductor material is a non-magnetic semiconductor material.

In advantageous embodiments of the current sensor device of this invention the first and/or second magnetic sensing elements are Hall effect elements.

In some embodiments the processing circuit is further arranged to determine a temperature signal by means of a temperature sensor in the processing circuit, hence in the silicon substrate, and to adjust the first signal and/or the second signal according to the determined temperature signal. The measured temperature is the temperature of the silicon substrate. Instead of or in addition to measuring the temperature, stress measurements can be performed by means of a stress sensor provided in the processing circuit in the silicon substrate.

In embodiments of the invention the processing circuit is arranged to adjust the first signal and/or the second signal based on the temperature signal and/or stress signal prior to computing the difference between the first and the second signal.

Advantageously, the at least two first magnetic sensing elements are orthogonally biased with respect to each other and/or the at least two second magnetic sensing elements are orthogonally biased with respect to each other.

In embodiments of the invention an adhesive layer is provided between the silicon substrate and the first sensing area and between the silicon substrate and the second sensing area, more precisely between the silicon substrate and the substrate of the respective sensing element(s).

In preferred embodiments the distance between the first edge of the active surface and the most nearby edge of a first magnetic sensing element of the first sensing area is less than 15% of the distance between the first edge and the second edge substantially opposite to the first edge.

In another aspect the invention relates to a current sensor system comprising a package comprising a current sensor device as previously described and a conductor for conducting electrical current, the conductor being outside that package comprising the current sensor device.

In another embodiment at least two first magnetic sensing elements of the current sensor device and at least two second magnetic sensing elements of the current sensor device are arranged in a direction perpendicular to the current direction.

In one embodiment the at least two first magnetic sensing elements of the current sensor device and at least two second magnetic sensing elements of the current sensor device are arranged in a direction parallel to the current direction.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

FIGS. 11A-11C illustrate embodiments of a system comprising a current sensor device and a conductor outside the package comprising the current sensor device. In FIG. 11A the current conductor is below the current sensor device. In the embodiment of FIG. 11B the current conductor is integrated in the printed circuit board. FIG. 11C illustrates a flip chip arrangement.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes a high sensitivity magnetic sensor device that allows for measuring a difference in magnetic field in sensing elements of at least two sensing areas (i.e. for performing a gradiometric measurement), while not being sensitive to uniform stray magnetic fields.

Figure 1:
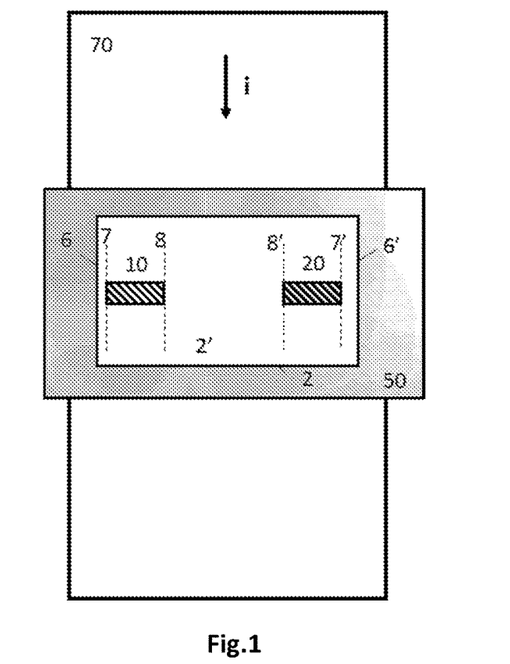
FIG. 1 illustrates a top view of an embodiment of the current sensor device of the invention disposed over a conductor and comprising two sensing clusters.

FIG. 1 illustrates a sensor device which is in this exemplary embodiment positioned on top of a conductor (70) that conducts electrical current in a current direction as indicated in the figure. The conductor can have a plurality of conductor surfaces and can be a laminated structure with different electrically isolated layers of materials, for example electrically conductive materials. The sensor device comprises a silicon die (2), on which are positioned two sensing areas (10,20) each comprising at least one magnetic sensing element in a semiconductor compound material, e.g. an III-V semiconductor. The current sensor device comprises a silicon substrate (2) having a front side (2') being the active side and a back side (not visible in FIG. 1). The sensing device can be disposed on, directly on, over, in contact with, for example in direct contact with, above, below or adjacent to a conductor surface of the conductor. In some embodiments the current sensor may be offset with respect to the centre of the conductor. The sensing areas are positioned at different locations on the active surface of the silicon substrate: a first sensing area (10) is disposed near a first edge (6) of the active surface of the substrate and a second sensing area (20) disposed near a substantially opposite edge (6') of the active surface of the substrate. The substrate typically has a rectangular or square shape. As shown in FIG. 1, the first sensing area (10) has an edge (7) near said first edge (6) of the active surface of the substrate. The second sensing area (20) has an edge (7') near a second edge (6') of the active surface at a side opposite to the first edge (6).

In the embodiment of FIG. 1 the sensing areas are spaced apart in a direction perpendicular to the current direction and arranged along said perpendicular direction. The sensing areas are arranged in parallel to the conductor top surface. In the embodiment of FIG. 1 the sensing elements in the sensing areas are for example arranged to be sensitive to magnetic fields in a direction perpendicular to the substrate. The sensing areas (10,20) in FIG. 1 have a rectangular shape. In other embodiments the sensing areas may be square shaped, but other, alternative shapes can be envisaged as well. In preferred embodiments each sensing area (10,20) has a surface that is relatively small compared to the area of the silicon substrate, for example less than or equal to 10% or 5% or even 1% of the active surface of the substrate, and comprises one or more sensing elements. Notwithstanding the reduced sensing area the proposed current device still offers an improved sensitivity due to its placement near the edge.

In some embodiments the distance from the first edge (6) of the active surface of the substrate to the closest edge (7) of the first area (10) is within 5% or preferably 10% or 15% of the distance L between said first edge (6) and the opposite edge (6'). The same holds for the distance from the second, opposite edge (6') of the active surface of the substrate to the closest edge (7') of the second area. In other embodiments the positioning is rather expressed in terms of the distance from the respective edge of the active surface of the substrate to the closest sensing element in the sensing area, more in particular to the substrate of that sensing element. The outer edge (7, 7') of e.g. the III-V substrate of the sensing element is then for example within 5% or preferably 10% or 15% of L of the respective nearest edge of the active surface. The inner edge (8, 8') of the sensing element then is for example away from the nearest edge of the active surface within 20% or preferably 25% or 30% of the distance L between said first edge (6) and the opposite edge (6').

As already mentioned, there are at least two sensing areas with sensing elements. In some embodiments there are for example three or four sensing areas. The sensing areas are disposed near the edges of the active surface of the silicon substrate. In some embodiments with three sensing areas two of the sensing areas may be positioned close to each other near a same edge of the substrate. In some embodiments with four sensing areas there may be two sensing areas near one edge and the other two sensing areas near the opposite edge. Many alternative are however available, as the skilled person will readily appreciate.

FIG. 1 also shows the housing (50) of the integrated circuit comprised in the current sensor device. The integrated circuit can be disposed on a printed circuit board or other wiring substrate. In some embodiments the integrated circuit may further include an integrated magnetic concentrator (IMC) in order to be able to sense a magnetic field parallel to the surface of the conductor. In preferred embodiments, however, there is no need for a concentrator or external shield and the device is a coreless current sensor. The sensor device is intrinsically insensitive to external fields (therefore, no need for a shield) and sensitive enough such that the field does not need to be concentrated (hence, no concentrator needed). The absence of shield and/or concentrator is beneficial for lowering the assembly cost.

The sensing elements in the sensing areas have a stacked structure in a semiconductor compound material, e.g. an III-V semiconductor. The stack comprises a substrate in e.g. a III-V semiconductor material, including GaAs.

In some embodiments xMR magnetic sensor technologies like e.g. giant magnetoresistive (GMR) sensors, tunnelling magnetoresistive (TMR) sensors, anisotropic magnetoresistive (AMR) sensors or flux gates, for example that sense in-plane magnetic fields, can be used instead of a Hall effect element and, possibly, an IMC. As generally known in the art, xMR magnetic sensors are responsive to a magnetic field parallel to the sensor surface, as opposed to Hall effect sensors which respond to a magnetic field perpendicular to the sensor surface.

In-plane magnetic fields can be parallel to the conductor surface 22 or to an average height of the conductor surface 22, if the conductor surface 22 is not planar. In other embodiments a vertical Hall sensor is used. In other embodiments a two-axis or three-axis magnetic field sensor is used (employing the Hall effect, AMR, GMR, or any other suitable sensing technology).

In most preferred embodiments of the current sensor device, Hall effect sensing elements made of a compound semiconductor material are used. Compared to embodiments based on xMR sensors or embodiments comprising a magnetic concentrator they have the advantage that there is no magnetic non-linearity, i.e. no hysteresis, and consequently no residual offset after a high current flow in the conductor, for example. These embodiments allow gaining sensitivity while keeping a high linearity, which is not possible with xMR or with a silicon Hall effect element with integrated magnetic concentrator.

Figure 2:
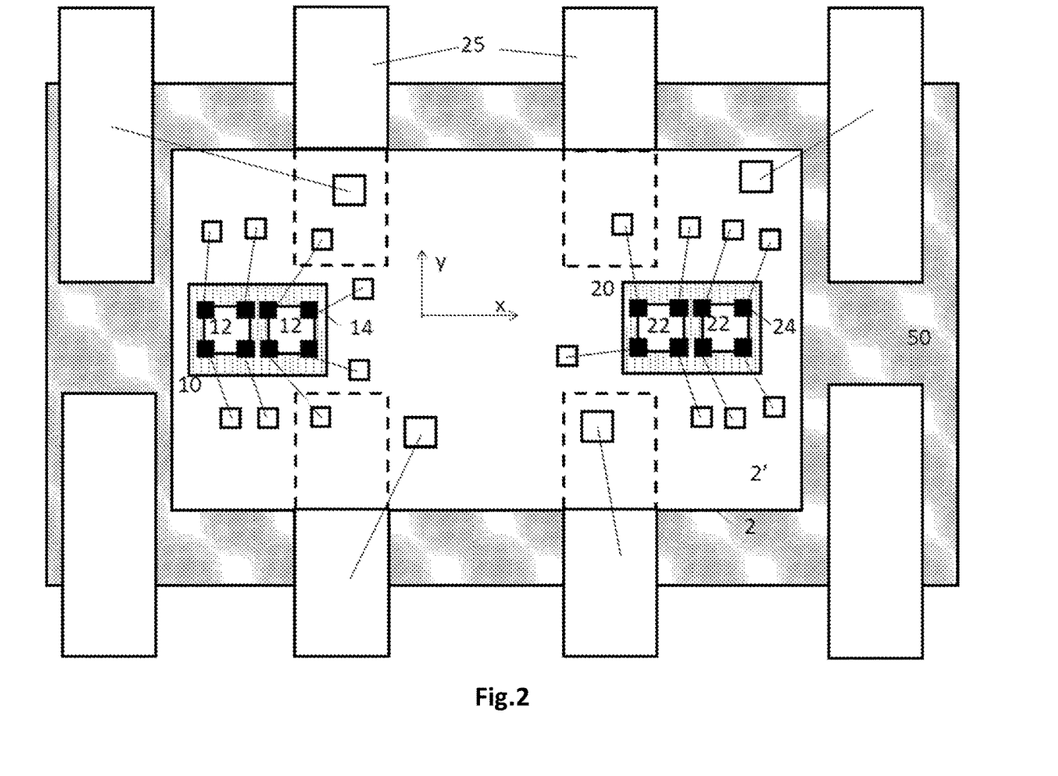
FIG. 2 illustrates an embodiment with two magnetic sensing elements per sensing cluster.

In the embodiment illustrated in FIG. 2 each sensing area comprises two magnetic sensing elements. Also other configurations are however possible, as will become apparent from embodiments presented later in this description. This silicon substrate (2) is in some embodiments (like for example in FIG. 2) disposed on a lead frame with leads (25) on the housing to establish connection of the integrated circuit to the outside world. The back side of the substrate then faces the lead frame. The active side of the substrate is above the lead frame. The lead frame may further have a base plate (not shown in FIG. 2). In other embodiments a flip-chip arrangement is implemented, whereby the silicon substrate is disposed on the lead frame but the active surface then faces the lead frame. At the front side of the substrate is located at a first position near a first edge of the active surface a first sensing area (10). At a second position of the silicon substrate, different from the first position, namely near a second edge opposite to said first edge of the active surface, is located a second sensing area. The second position is shifted from the first position in a direction perpendicular to the current direction, as can also be seen from FIG. 1. The silicon substrate comprises a processing circuit wherein signals coming from the sensing areas are further processed (as detailed later in this description).

Each sensing area comprises one or more magnetic sensing elements. The at least one magnetic sensing element of a first sensing area is in a first compound semiconductor material and the at least one magnetic sensing element of a second sensing area is in a second compound semiconductor material. In some embodiments the first and the second compound semiconductor material is the same. A compound semiconductor material is made from two or more elements. Common elements for compound semiconductors comprise for example binary III-V materials like e.g. GaAs, InP, InSb, or ternary alloys, e.g. AlGaAs or InGaAs. The at least two sensing areas, more in particular their sensing elements, are coupled to the active surface of the silicon substrate. This coupling can be realized in various ways, which are all well-known to the skilled person. For example, in an advantageous embodiment die attach glue can be used, in other words in between the dice (i.e. between the silicon substrate and the compound semiconductor substrate) an adhesive layer is applied, which introduces thermal isolation. This thermal isolation, however, does not prevent performing a temperature compensation. The thickness of the die attach glue layer is typically more than 10 µm, e.g. in the range 10-20 µm. With transfer printing, the thickness of the adhesive can be lower, e.g. in the range 0.5 to 5 µm.

In preferred embodiments the sensing areas each comprise a plurality of sensing elements, e.g. two to four elements, which then form a cluster of sensing elements in each of the sensing areas. The signals derived from the sensing elements can be combined in order to reduce or remove an offset voltage from the Hall voltage. In preferred embodiments the signals are combined in the electronic processing circuit of the silicon substrate. In other embodiments the signals of the sensing elements within each cluster are combined with direct electrical connections, i.e. they are hard-wired.

In a preferred embodiment as shown in FIG. 2, each sensor area comprises two or more magnetic sensing elements (12,22) implemented as Hall plates, each Hall plate having four contacts (14,24). A configuration with clusters of at least two magnetic sensing elements is advantageous, for example for performing offset cancellation. The two or more Hall plates of a cluster are most preferably orthogonally biased. As well known in the art, this means that the operation of the Hall plates is based on pairing an even number of plates and biasing them orthogonally so that orthogonal current directions are obtained. Each contact pad is electrically connected to the processing circuit. Hence, in case the connections to the integrated circuit are made independently, with a sensor cluster in each sensing area and two Hall plates per cluster as in the example of FIG. 2 one has 16 contact pads in total. In some embodiments each contact pad is electrically connected to the processing circuit via a wire bonding. In other embodiments the magnetic sensing elements can be hard-wired together before being connected to the integrated circuit. In the example with two Hall plates per cluster one then has the contact pads of one cluster of sensing elements hard-wired per pair, resulting in four contacts to the processing circuit per cluster. Due to the use of hardwiring the number of contacts is reduced.

In embodiments the sensor device comprises a redistribution layer (RDL) to route the connections from the sensing areas (i.e. from the sensing elements comprised therein) to the silicon chip. Such RDL processing is particularly useful to apply in case of a thin substrate. This typically comes along with the use of transfer printing (involving a lift off process), whereby patterning is performed to create metallic interconnections on the surface of the substrate using standard photolithography.

In FIG. 2 the sensing areas are shifted with respect to one another in the X-direction, perpendicular to the current direction (being the Y-direction in FIG. 2). In the example embodiment of FIG. 2 the various Hall plates in the sensing areas are aligned along the X-axis. In other embodiments there may be some offset in the Y-direction between the two sensing areas (10,20), although this may be less efficient in terms of chip area. In yet other embodiments at least one sensing area may be slightly tilted with respect to the x-axis, for example over an angle of 1° or 3° or 5° or 7° or 10°.

The proposed configuration offers the advantage that within each sensing area a biasing sequence can be applied in a flexible and independent manner. As well known in the art, a biasing sequence is used for performing current spinning, whereby an excitation signal is alternately applied to one of a first and a second set of contacts, while detecting an output signal over the other set by abruptly switching a constant bias voltage or current between the two sets and reading out the other set. For example, the current spinning in one Hall plate may be done clockwise and counter clockwise in the other Hall plate of the cluster. The biasing may be done in a different direction in the second sensing area, i.e. in the second sensing cluster. This allows choosing the sequence yielding the best performance in terms of offset reduction and drift. The best sequence may depend on the type of package (stress), the operating temperature range of the sensor and the application.

The processing circuit (30) disposed in the silicon substrate is arranged to receive signals from the one or more sensing elements in the respective sensing areas. A block scheme of a possible implementation of the processing circuit (30) is provided in FIG. 3. The circuit input signals come from the first and second sensing elements in the first and the second sensing area, respectively. In some embodiments the signals from the first sensing area (10) are processed separately from the signals coming from the second sensing area (20). A first (34) and a second (36) signal, respectively, are so derived. Difference computation means (37) are provided to compute a signal indicative of the difference (38) between the first and the second signal. When processed separately, the signals from the sensing elements in the first and second areas can be compensated before a difference is computed. This compensation can be achieved in different ways. For example, the biasing current of the respective sensing elements can be adjusted or the amplification stage gain after the sensing elements can be adjusted. Alternatively, the signals can be digitized and a correction is applied in the digital domain. In all these example compensation approaches it is advantageous to compensate before computing a difference signal. By matching the sensor sensitivities in that way the effect of an offset field in the output signal can be reduced. If the sensitivities are not matched, i.e. not adjusted separately before taking a difference, the difference signal contains an error component proportional to the mismatch and the offset field. An offset field can be an external parasitic field, or an offset in the field generated by the current conductor itself in case the sensors are not symmetrically centred with respect to conductor (mechanical tolerances or willingly off-axis).

In other embodiments the first and second signal are not processed separately. The signals may for example be fed to a low noise amplifier, such as for example a dual difference amplifier. The difference signal is then compensated after computing the difference between the two signals. However, this does not yield the above-mentioned advantages obtained when providing for compensation before the difference between the two signals is made.

Figure 3:
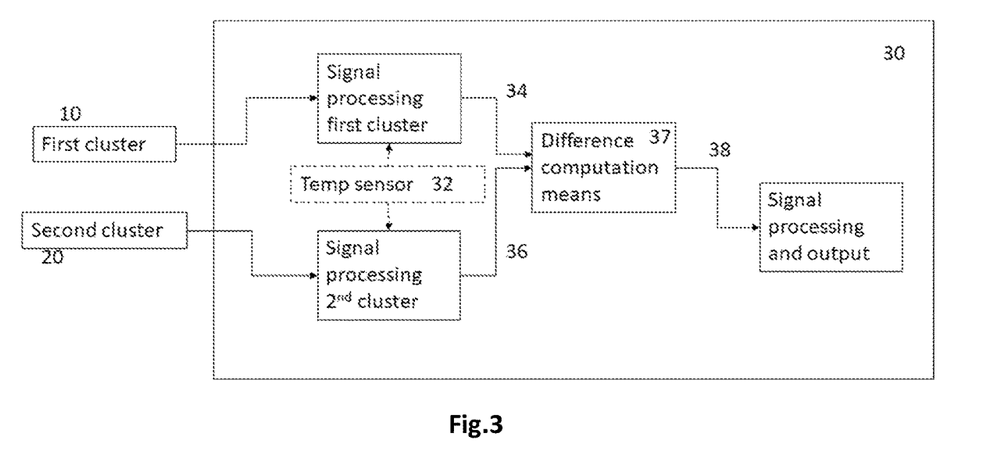
FIG. 3 illustrates a block scheme of an embodiment of the processing circuit of the current sensing device.

In an advantageous embodiment the processing circuit further comprises a temperature sensor (32) to measure the temperature in the current sensor device. As the processing circuit is disposed in the silicon substrate, the temperature sensor is arranged to measure the temperature of the substrate. In that case it is possible to take the measured temperature into account when deriving said first and said second signal. Consequently also in the resulting difference signal the temperature is accounted for. This may be advantageous, as the temperature is known to affect the sensitivity of the current sensor. Instead of a temperature sensor or in addition to the temperature sensor a stress sensor may be present in the processing circuit in the silicon die.

More in particular, the compensation may include temperature or stress information, or information on both temperature and stress. In embodiments the temperature and/or stress signals are measured in the silicon die, with one or more temperature sensors and/or one or more stress sensors, respectively. An advantage of locating the temperature sensor in the silicon substrate is that the size of the stacked III-V die is reduced, since no area must be used for a temperature sensor and contact pads in the III-V die. Also the number of wirebonds can be reduced. It is a further advantage that the differential signal error caused by sensitivity mismatch between the two clusters over temperature can be highly reduced. In particular, the dependence on temperature and/or stress of the sensing elements within the first cluster can be different than in the second cluster, as the second cluster is located in the second sensing area at a location relatively far from the first sensing area containing the first cluster. In other words, the magnetic sensitivity of the elements within the first cluster in the first sensing area may drift in a different way over temperature and/or lifetime with respect to the elements of the second cluster in the second sensing area. Individual signal compensation of each cluster before computing a difference allows error reduction due to mismatches between sensing elements from different clusters, especially when they have different drift characteristics. The signals can be corrected (based on temperature and/or stress) by correcting the biasing current of the sensing elements. The proposed solution also leads to a more cost effective device.

Figure 4:
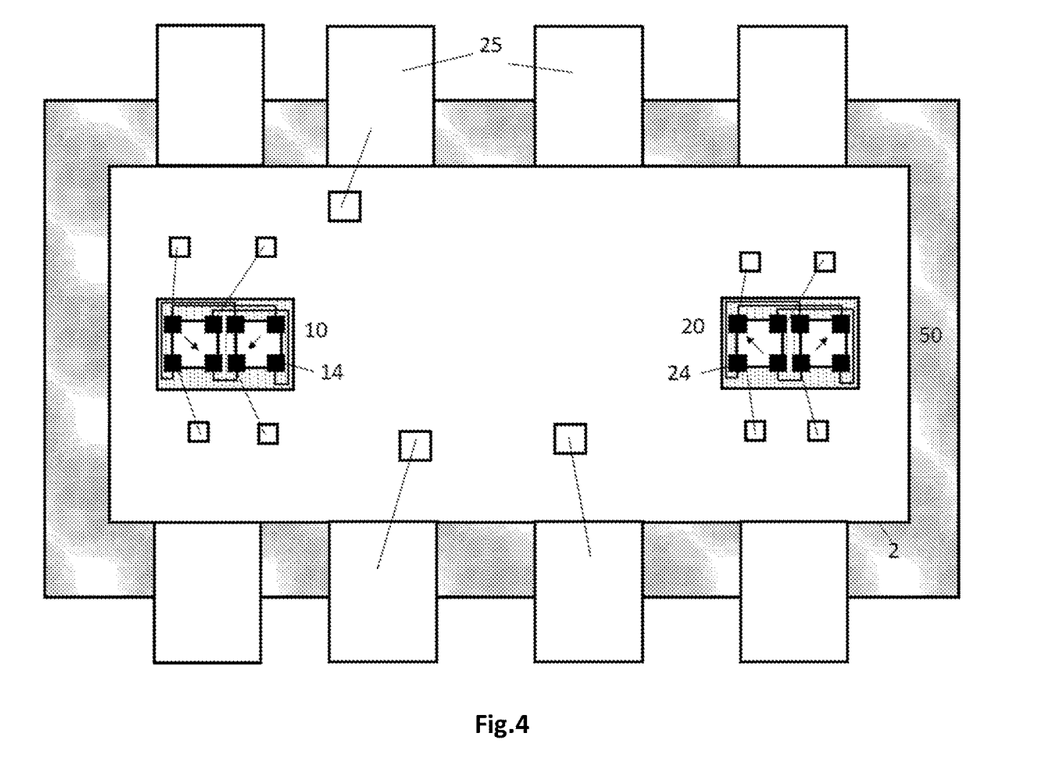
FIG. 4 illustrates an embodiment of the current sensor device wherein hardwiring is applied.
Figure 5:
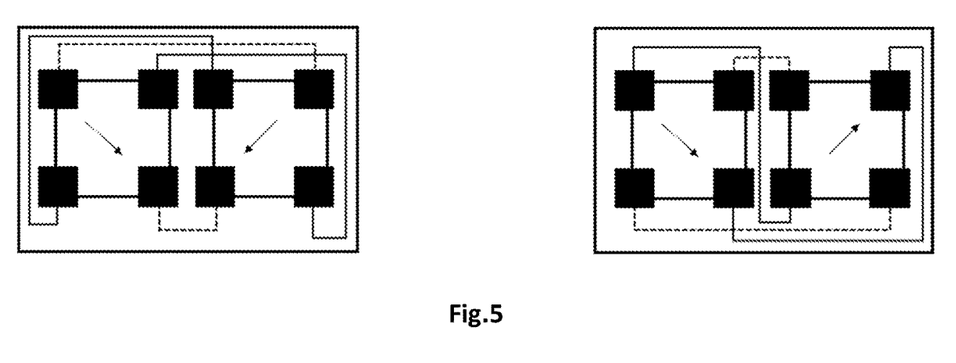
FIG. 5 illustrates a more detailed view on the wiring.

FIG. 4 illustrates an embodiment wherein the two Hall plates present in each sensing area (10,20) are hardwired in parallel such that the biasing currents or voltages between the two plates within a cluster are always orthogonal. The second cluster in the second sensing area (20) may be biased with the same contacts as the first cluster in the first sensing area (10), and may be biased in opposite direction (as shown). The second cluster may also be biased with the other pair of contacts (not shown). Again the clusters in the two sensing areas are shifted with respect to each other in the X-direction. FIG. 5 gives a more detailed view on the connections between the contacts of FIG. 4. Two redistribution layers are required, one for the connections indicated in dashed lines and one for the connections indicated in solid lines.

Figure 6:
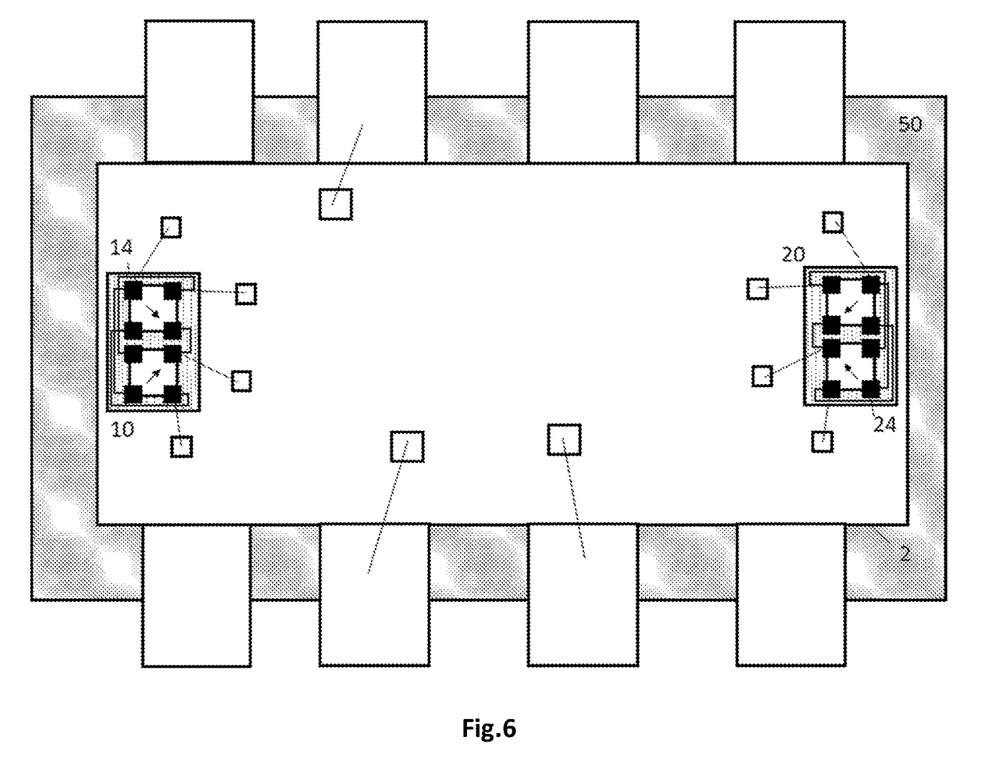
FIG. 6 illustrates an embodiment wherein the magnetic sensing elements are arranged in parallel to the current direction.

In FIG. 6 the two pairs of sensing elements within the sensing areas (10,20) are oriented in parallel to the current direction. Such a set-up offers the benefit that both Hall plates forming a sensing cluster in a sensing area sense the same magnetic field, as the radius from the conductor is the same (which is not the case in the embodiments of e.g. FIG. 2 or FIG. 4). However, independent electrical connection of each contact is more difficult in this case while keeping a maximal distance between the sensing clusters, so that hardwiring is required in order to reduce the number of contacts.

Figure 7:
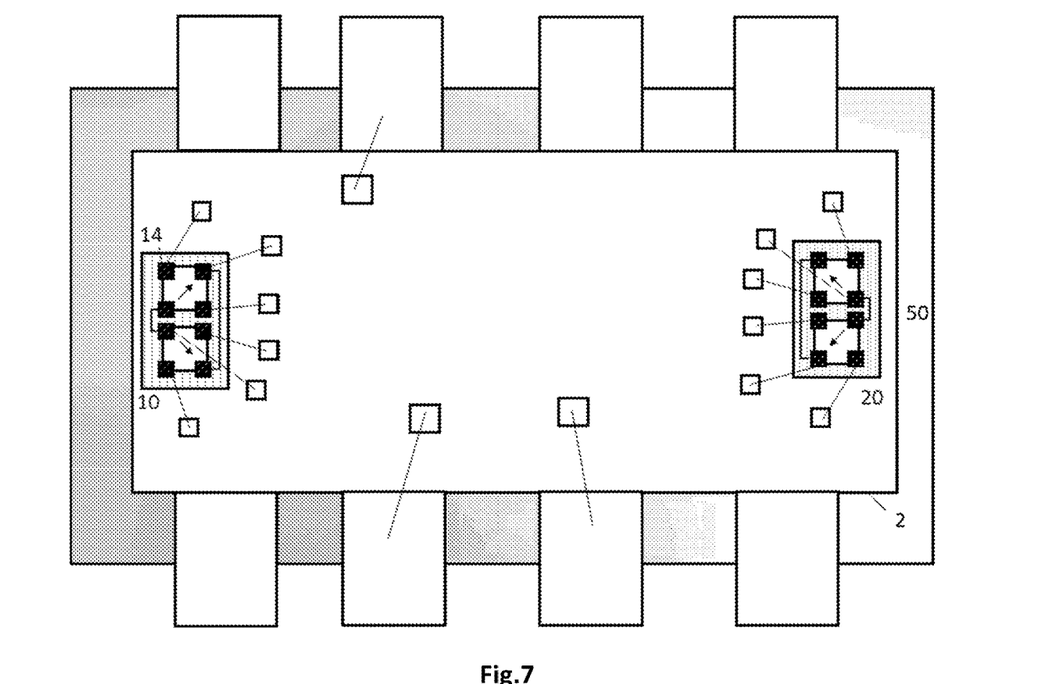
FIG. 7 illustrates another embodiment with partial hardwiring.

FIG. 7 shows an embodiment with partial hardwiring, i.e. not all contacts are connected via a hardwire. In this embodiment only one redistribution layer on the sensing elements in III-V material is needed.

Figure 8:
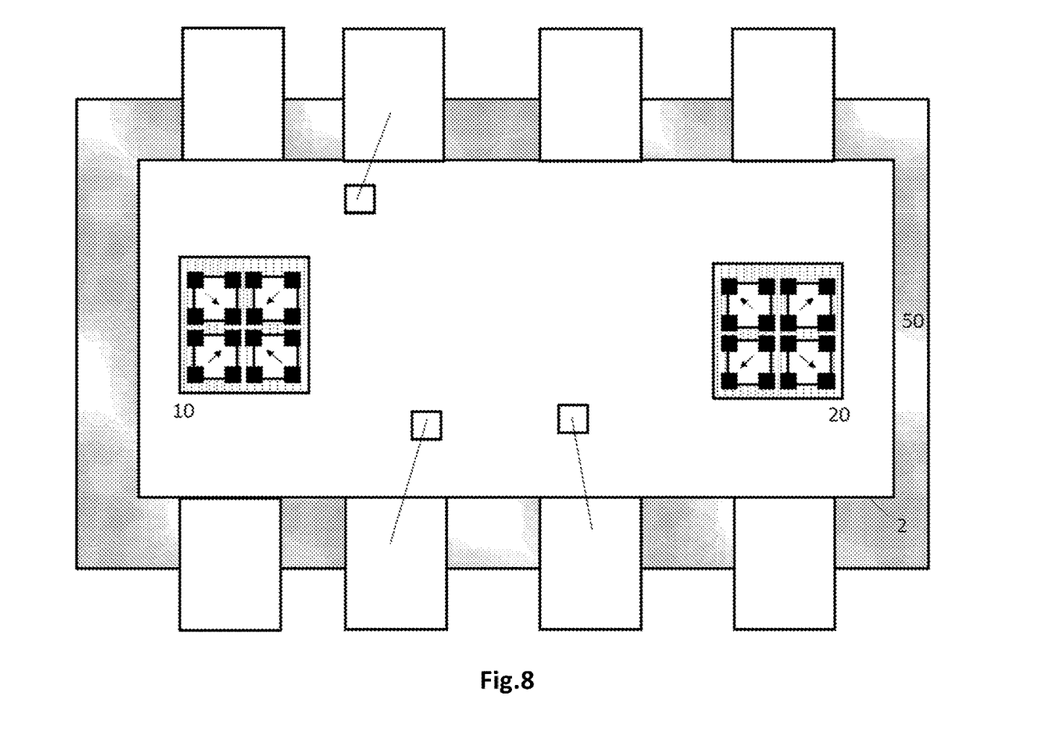
FIG. 8 illustrates an embodiment of the current sensor device with four Hall plates per sensing cluster.

FIG. 8 illustrates an embodiment with in each sensing area four Hall effect elements forming a sensor cluster. The right and left cluster may be biased in opposite directions. The Hall elements in the embodiment of FIG. 8 can be electrically connected to the silicon substrate in similar manners as described in the previous embodiments.

Figure 9:
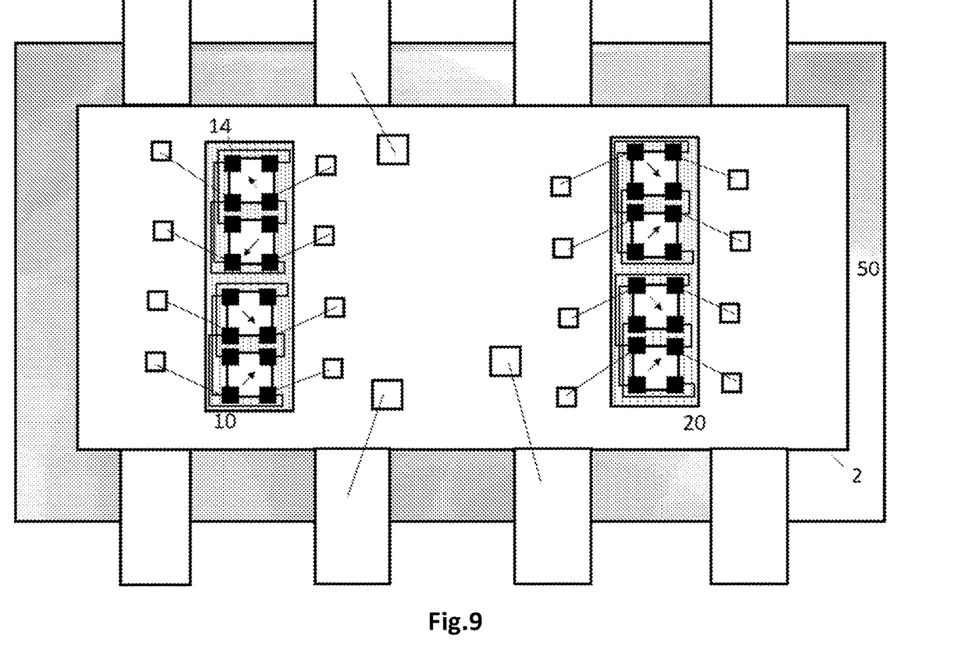
FIG. 9 illustrates another embodiment with four magnetic sensing elements per sensing cluster.

In the embodiment of FIG. 9 there are also four Hall effect elements in each sensor cluster. The alignment of the Hall effect elements per cluster is in the same direction as the current flows. In an alternative embodiment the sensors may be aligned in a direction perpendicular to the current. Some of the elements may be hard wired (as shown in FIG. 9).

Figure 10:
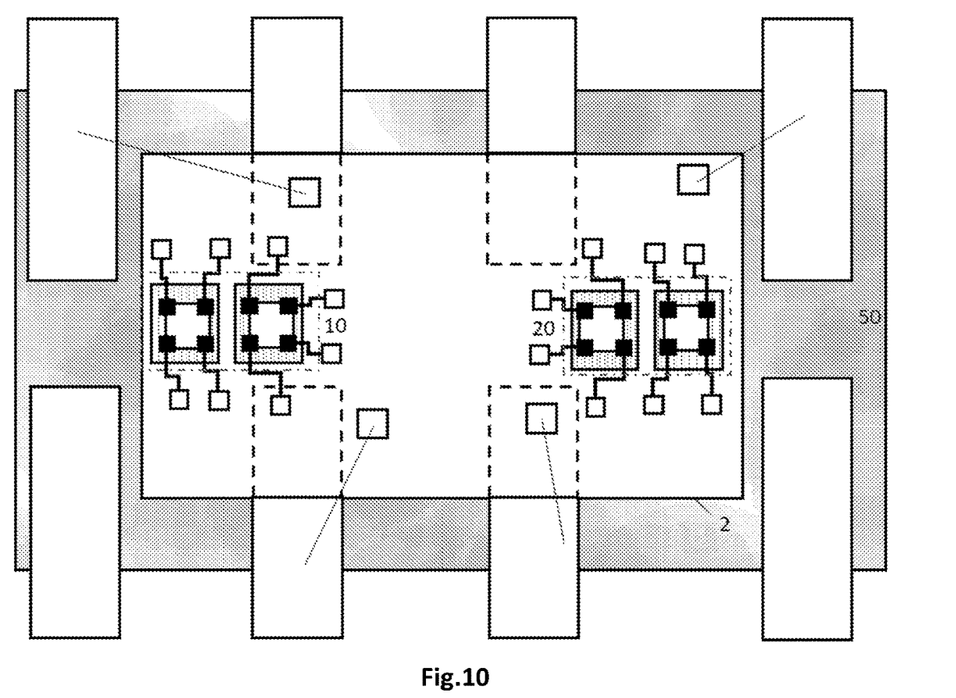
FIG. 10 illustrates an embodiment with two sensing elements per sensing cluster.

An alternative embodiment is illustrated in FIG. 10. Each cluster now comprises two sensing elements, whereby each sensing element comprises a single Hall effect element. This can be achieved by applying so called 'transfer printing'.

Transfer printing is a technique well known in the art, which allows assembling and integrating in a deterministic way thin, fragile and small devices. A soft elastomeric stamp (acting as transfer device) is thereby brought into contact with a donor substrate, on which "inks" (semiconductor devices) are prepared in an ordered and releasable manner, usually through wet chemical etching or dry etching (e.g., laser lift-off). The inked stamp is then brought into contact with the receiver substrate followed by the modulation of the stamp/ink adhesion to print inks (i.e. the semiconductor devices) onto the receiver substrate. The removal of the stamp completes the transfer printing process.

In case transfer printing is applied, the sensing elements do not comprise a thick substrate but only the active area obtained from one or more other substrate by lift-off. The sensing elements are then transferred to the silicon die and connected to the silicon die with a redistribution layer (no wire bonds).

Figure 11A:
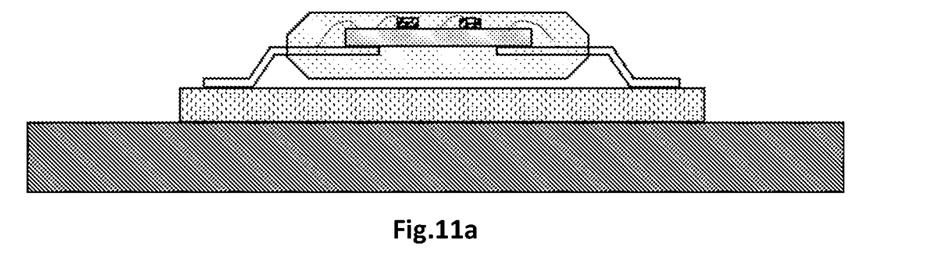
Figure 11B:
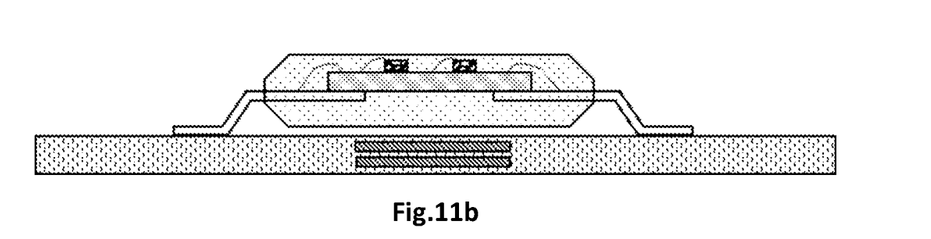

In some embodiments the conductor is external to the current sensor device and can be positioned e.g. below (as in FIG. 11a) or above the current sensor device. In other embodiments the conductor may be integrated in the printed circuit board whereon the sensor structure is assembled. This is illustrated in FIG. 11b. The conductor in the printed circuit board may comprise one metal layer, or two metal layers (FIG. 11b), or multiple metal layers. In some embodiments, the current conductor width and/or thickness is smaller in the vicinity of the current sensor, such as to locally increase the current density and increase the sensed magnetic field at the sensor location.

Figure 11C:
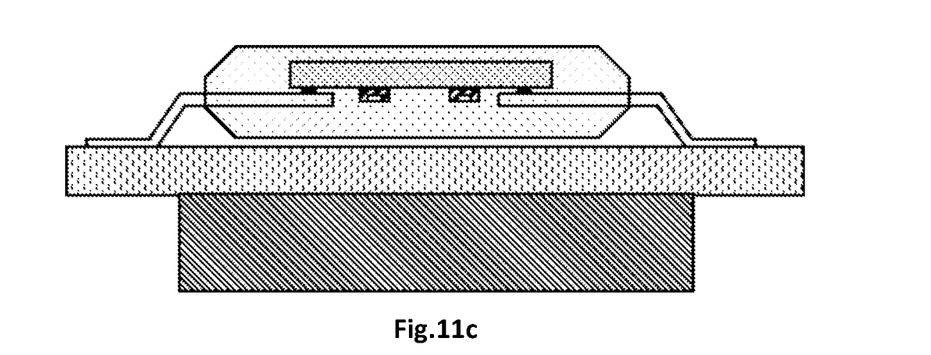

FIG. 11c shows another possible implementation. The silicon substrate is disposed on the lead frame as in FIGS. 11a and 11b but the active surface then faces the lead frame. Hence, the sensing clusters are now arranged in opposite direction compared to FIGS. 11a and 11b. Solder balls can be used between the silicon substrate and the lead frame.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A current sensor device comprising:
    a silicon substrate having an active surface,
    a first sensing area disposed near a first edge of said active surface of said silicon substrate, said first sensing area comprising at least one first magnetic sensing element made of a first compound semiconductor material and at least four contact pads,
    a second sensing area disposed near a second edge of said active surface of said silicon substrate, said second edge being substantially opposite to said first edge, said second sensing area comprising at least one second magnetic sensing element made of a second compound semiconductor material and at least four contact pads,
    a processing circuit disposed in said silicon substrate and electrically connected via wire bonds and/or a redistribution layer with said contact pads of said first and of said second sensing area and arranged to derive a first signal based on signals received from said at least one first magnetic sensing element of said first sensing area, to derive a second signal based on signals received from said at least one second magnetic sensing element of said second sensing area and to compute a difference between said first and said second signal.

2. The current sensor device as in claim 1, wherein said first sensing area comprises at least two first magnetic sensing elements and said second sensing area comprises at least two second magnetic sensing elements.

3. The current sensor device as in claim 1, wherein said at least one first magnetic sensing element and/or said at least one second magnetic sensing elements is/are so positioned that there is no overlap with a lead frame of said current sensor device.

4. The current sensor device as in claim 1, wherein said first compound semiconductor material and/or said second compound semiconductor material is a III-V semiconductor material.

5. The current sensor device as in claim 1, wherein said current sensor device is coreless.

6. The current sensor device as in claim 1, wherein said first and/or second magnetic sensing elements are Hall effect elements.

7. The current sensor device as in claim 1, wherein said processing circuit disposed in said silicon substrate comprises a temperature and/or a stress sensor and is arranged to determine a temperature signal and/or stress signal from said temperature and/or stress sensor.

8. The current sensor device as in claim 7, wherein said processing circuit is arranged to adjust said first signal and/or said second signal based on said temperature signal and/or stress signal prior to computing said difference between said first and said second signal.

9. The current sensor device as in claim 2, wherein said at least two first magnetic sensing elements are orthogonally biased with respect to each other and/or said at least two second magnetic sensing elements are orthogonally biased with respect to each other.

10. The current sensor device as in claim 1, wherein an adhesive layer is provided between said silicon substrate and said first sensing area and between said silicon substrate and said second sensing area.

11. The current sensor device as in claim 1, wherein the distance between said first edge and a most nearby edge of a first magnetic sensing element of said first sensing area is less than 15% of the distance between said first edge and said second edge substantially opposite to said first edge.

12. A current sensor system, comprising a current sensor device as in claim 1 and comprised in a package and a conductor for conducting electrical current, said conductor being outside said package comprising said current sensor device.

13. The current sensor system as in claim 12, wherein at least two first magnetic sensing elements of said current sensor device and at least two second magnetic sensing elements of said current sensor device are arranged in a direction perpendicular to the direction of said electrical current.

14. The current sensor system as in claim 12, wherein at least two first magnetic sensing elements of said current sensor device and at least two second magnetic sensing elements of said current sensor device are arranged in a direction parallel to said current direction.

\* \* \* \* \*